(12) United States Patent
Kubo

(10) Patent No.: US 11,226,213 B2
(45) Date of Patent: Jan. 18, 2022

(54) CAPACITIVE PROXIMITY SENSOR

(71) Applicant: Tokyo Parts Industrial Co., Ltd., Gunma-ken (JP)

(72) Inventor: Mamoru Kubo, Gunma-ken (JP)

(73) Assignee: Tokyo Parts Industrial Co., Ltd., Gunma-ken (JP)

(*) Notice: Subject to any disclaimer, the term of this patent is extended or adjusted under 35 U.S.C. 154(b) by 324 days.

(21) Appl. No.: 16/665,131

(22) Filed: Oct. 28, 2019

(65) Prior Publication Data

US 2020/0232824 A1 Jul. 23, 2020

(30) Foreign Application Priority Data

Jan. 23, 2019 (JP) .............................. JP2019-009097

(51) Int. Cl.
| | |
|---|---|
| *G01D 18/00* | (2006.01) |
| *G01D 5/241* | (2006.01) |
| *H03K 17/955* | (2006.01) |
| *G01D 5/24* | (2006.01) |

(52) U.S. Cl.
CPC .......... *G01D 5/2405* (2013.01); *G01D 18/00* (2013.01); *G01D 5/241* (2013.01)

(58) Field of Classification Search
CPC ...... G01D 18/00; G01D 5/2405; G01D 5/241; H03K 17/954; H03K 17/955; H03K 2217/94031

USPC .......................................................... 702/65
See application file for complete search history.

(56) References Cited

U.S. PATENT DOCUMENTS

| | | | |
|---|---|---|---|
| 6,446,012 B1 * | 9/2002 | Macke, Sr | G08B 13/26 702/108 |
| 9,582,111 B2 * | 2/2017 | Rouaissia | G06F 3/0443 |
| 2017/0350169 A1 * | 12/2017 | Kubo | E05B 85/10 |
| 2018/0135339 A1 * | 5/2018 | Kubo | G07C 9/00 |
| 2020/0025964 A1 * | 1/2020 | Kubo | G01V 3/08 |

FOREIGN PATENT DOCUMENTS

| | | |
|---|---|---|
| JP | 2001055852 A | 2/2001 |
| JP | 2002039708 A | 2/2002 |
| JP | 2002057564 A | 2/2002 |
| JP | 2014500414 A | 1/2014 |
| JP | 2015021238 A | 2/2015 |

* cited by examiner

*Primary Examiner* — Ly D Pham
(74) *Attorney, Agent, or Firm* — Jordan and Koda, PLLC

(57) ABSTRACT

The capacitive proximity sensor includes an oscillation means, an LCR resonance circuit including a sensor electrode, a sensor circuit that outputs a determination voltage signal corresponding to the capacitance of the sensor electrode, and a control unit that detects the proximity of a human body to the sensor electrode based on the determination voltage signal. The control unit performs control that alternatingly and repeatedly executes calibration steps for updating a detection frequency $f_1$ and a first threshold value $V_{th1}$ and a detection step for detecting the proximity of the human body to the sensor electrode.

8 Claims, 12 Drawing Sheets

CAPACITIVE PROXIMITY SENSOR

BACKGROUND OF THE INVENTION

The present invention relates to a capacitive proximity sensor that is installed, for example, in a rear bumper of an automobile, and detects a user's foot.

Technology is conventionally known in which a user's foot is detected using an electrostatic sensor installed in the lower part of a vehicle in order to open and close a vehicle door (back door, sliding door or the like), and in which the vehicle door is opened and closed based on the detection results.

For example, Japanese Patent Laid-Open Publication No. 2015-21238 discloses a device for opening and closing a vehicle door having a plurality of lower electrostatic sensors that detect a user's foot and an upper electrostatic sensor that detects a user's body, other than the user's feet. In this device for opening and closing a vehicle door, when a detection signal from one of the lower electrostatic sensor sensor-units and a detection signal from the upper electrostatic sensor are obtained, a drive signal for driving vehicle door open or driving the vehicle door closed is output to the door drive device. However, if detection signals are obtained from two or more of the lower electrostatic sensor sensor-units, the drive signal is not output to the door drive device.

With the device for opening and closing a vehicle door in Japanese Patent Laid-Open Publication No. 2015-21238, when a user is detected by at least two of the lower electrostatic sensor sensor-units, opening or closing of the vehicle door is not started, or is stopped, whereby user safety can be maintained.

Furthermore, Japanese Translation of PCT International Application Publication No. JP-T-2014-500414 discloses a sensor unit having two proximity sensors for operating a vehicle door in a non-contact manner. When this sensor unit is used for opening and closing a tailgate, sensor units are arranged in the rear bumper of the vehicle, parallel to the transverse direction of the vehicle, and the detection area of one proximity sensor extends into the detection area of the other proximity sensor.

With the sensor unit disclosed in the Japanese Translation of PCT International Application Publication No. JP-T-2014-500414, by evaluating signals generated by at least two proximity sensors, movement in the Y direction and the movement in the X direction or the Z direction can be distinguished, and user requests for opening or closing the vehicle door can be accurately detected.

However, the capacitive sensors disclosed in these publications have a problem that the output is likely to change depending on the surrounding environment (for example, temperature, humidity, surrounding structures or the like). In particular, resonance type capacitive sensors detect changes in a signal using a frequency in the vicinity of the resonance point, and thus there is a problem in that erroneous detection is likely to occur in conjunction with changes in the resonance point.

SUMMARY OF THE INVENTION

One or more embodiments of the present invention provide a resonance-type capacitive proximity sensor that prevents erroneous detection and can detect the proximity of a human body with high reliability.

One mode of embodiment of the capacitive proximity sensor of the present invention comprises:
an oscillation means, which outputs a high-frequency signal;
an LCR resonance circuit including a sensor electrode, to which the high-frequency signal is input;
a sensor circuit, which outputs a determination voltage signal corresponding to the capacitance of the sensor electrode; and
a control unit, which detects the proximity of a human body to the sensor electrode, on the basis of the determination voltage signal, wherein
the control unit performs step control, which controls the execution of calibration steps and a detection step;
the step control includes control for repeatedly and alternatingly executing the calibration steps and the detection step, as a normal routine;
in the calibration steps:
in each of the calibration steps, the frequency of the high-frequency signal is changed according to predetermined rules, in order to detect a resonance frequency $f_{res}$ of the LCR resonance circuit when an object is not in the proximity of the sensor electrode, and
when the resonance frequency $f_{res}$ is detected, the detection frequency $f_1$ is set based on the resonance frequency $f_{res}$, and a first threshold value $V_{th1}$ is set based on a determination voltage signal $V_{res}$ when a high-frequency signal at the resonance frequency $f_{res}$ is input to the LCR resonance circuit; and
in the detection step:
the proximity of the human body to the sensor electrode is detected based on the result of a comparison between the first threshold value $V_{th1}$ and the determination voltage signal detected with the high-frequency signal at the detection frequency $f_1$ is input to the LCR resonance circuit.

With the capacitive proximity sensor of the present invention, detection is performed with the resonance frequency $f_{res}$ rapidly updated to the most recent value, whereby detection can always be performed at the most recent detection frequency, even if the surrounding environment changes, such that it is possible to prevent erroneous detection and missed detection so as to reliably detect the proximity of a human body.

DETAILED DESCRIPTION OF THE PREFERRED EMBODIMENTS

Hereafter, an exemplary mode of embodiment of the present invention is described with reference to the drawings.

Figure 1:
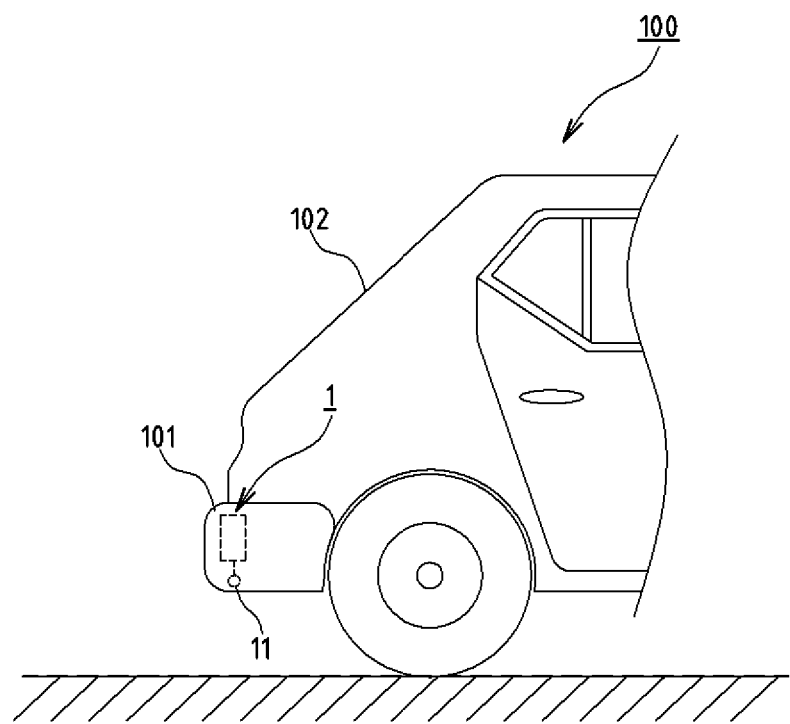
FIG. 1 is a schematic diagram showing the manner in which a capacitive proximity sensor according to one exemplary mode of embodiment of the present invention is installed in an automobile.

The capacitive proximity sensor 1 according to one exemplary mode of embodiment of the present invention is installed in a rear bumper 101 of an automobile 100, as shown in FIG. 1, and when the user inserts a foot below the rear bumper 101, open/close control of the back door 102 is automatically achieved.

Figure 2:
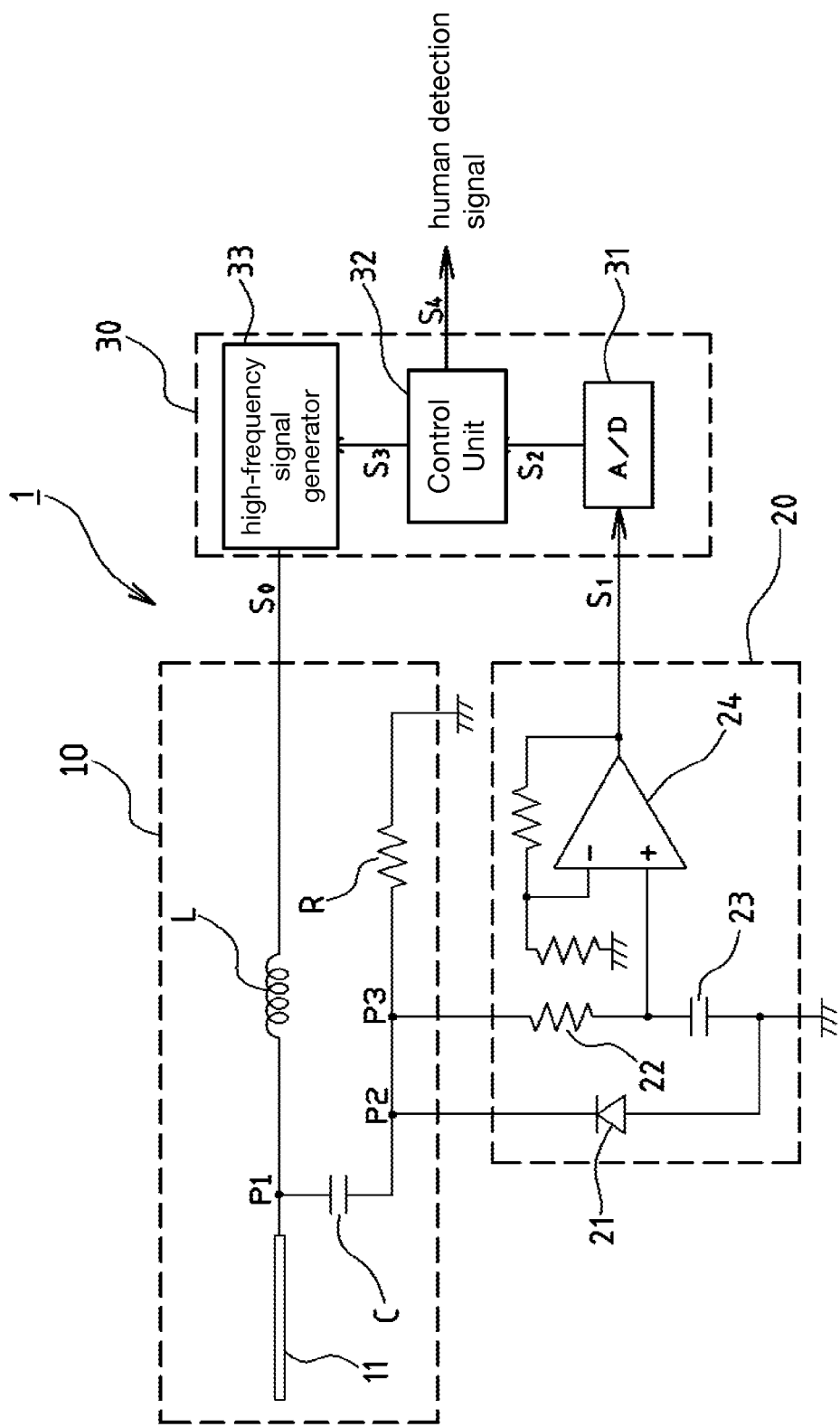
FIG. 2 is a block diagram schematically showing the configuration of a capacitive proximity sensor according to one exemplary mode of embodiment of the present invention.

As shown in the block diagram in FIG. 2, the proximity sensor 1 of this example principally comprises an LCR resonance circuit 10, a sensor circuit 20, and a microcomputer 30.

The LCR resonance circuit 10 is provided with: an LCR series resonance circuit in which a coil L, a capacitor C, and a resistor R are connected in series in this order; and a sensor electrode 11. In order to detect a foot of a user of the automobile 100 a predetermined high-frequency signal $S_0$ is input to the sensor electrode 11 from a high-frequency signal generation unit 33. The sensor electrode 11 is connected in parallel with the capacitor C to a sensor electrode connection point P1 downstream of the coil L and upstream of the capacitor C. When a human foot or the like approaches this sensor electrode 11, the self-capacitance of the sensor electrode 11 increases. The inductance of the coil L in the present example is 4.7 mH, the capacitance of the capacitor C is 7 pF, and the resistance of the resistor R is 470Ω, but these values can be set as appropriate.

The sensor electrode 11 is linearly arranged inside the rear bumper 101 along the vehicle width direction of the automobile 100 (perpendicular to the plane of FIG. 1). There are no limitations on the material for the sensor electrode 11, and an insulated wire, a coaxial cable, a conductive metal plate such as a copper plate or the like can be used. When an insulated wire or a coaxial cable is used, the sensitivity can easily be adjusted by increasing the electrode area, by way of bending this in one or more out-and-back returns.

The sensor circuit 20 has a diode 21 for half-wave rectification, a fixed resistor 22 and a capacitor 23 constituting a low-pass filter, and an amplifier (buffer circuit) 24. This sensor circuit 20 outputs a determination voltage signal $S_1$ corresponding to the self-capacitance of the sensor electrode 11, based on an electrical signal output from the LCR resonance circuit 10. Specifically, the sensor circuit 20 outputs the determination voltage signal $S_1$ based on the electrical signal at the detection point P3 downstream of the capacitor C and upstream of the resistance R. A diode 21 is connected at a rectification point P2 between the capacitor C and the detection point P3. Note that sensor circuit 20 can have any circuit configuration, so long as it outputs a determination voltage signal $S_1$ corresponding to the self-capacitance of the sensor electrode 11. Furthermore, by lowering the resistance value of the resistor R, it is possible to reduce the influence of noise.

By inputting the electrical signal to the sensor circuit 20 at the detection point P3 downstream of the capacitor C and upstream of the resistor R in the LCR resonance circuit 10, as in the present example, self-capacitance in the sensor electrode 11 can be detected using an inexpensive detection circuit with high input impedance. Specifically, in the proximity sensor 1 of this example, the current flowing in the LCR resonance circuit 10 is converted to a voltage and input to the sensor circuit 20, wherein the sensor circuit 20 is not directly connected to the sensor electrode 11. For this reason, the sensor circuit 20 has little influence on the self-capacitance of the sensor electrode 11, and can detect the self-capacitance of the sensor electrode 11 even if the input impedance of the sensor circuit 20 changes slightly due to environmental temperature changes or the like.

The microcomputer 30 includes an AD converter 31, a control unit 32, and a high-frequency signal generation unit 33. The AD converter 31 performs A/D conversion of the determination voltage signal $S_1$ input from the sensor circuit 20, and outputs this to the control unit 32 as a determination signal $S_2$. As will be described in detail hereafter, the control unit 32 outputs a control signal $S_3$ to the high-frequency signal generation unit 33, and if it is determined that a human foot has approached the sensor electrode 11 based on the determination signal $S_2$ (in other words, the determination voltage signal $S_1$), outputs a human detection signal $S_4$. The high-frequency signal generation unit 33, which serves as an oscillator means, will be described in detail below, but this outputs a high-frequency signal $S_0$, having a predetermined frequency and a predetermined duty ratio, to the LCR resonance circuit 10, on the basis of the control signal $S_3$, input from the control unit 32.

In this example, a rectangular-wave high-frequency signal is used as the high-frequency signal $S_0$. There are no limitations on the frequency of the high-frequency signal $S_0$ but, in applications in which the proximity sensor 1 is installed in the rear bumper 101 in order to detect a user's foot, as in this example, frequencies of 200 kHz to 1000 kHz are preferable, in consideration of the detection region and detection sensitivity. Note that the high-frequency signal $S_0$ is not limited to rectangular waves, but rather sine waves, triangular waves and the like may be used.

The high-frequency signal $S_0$ input to the LCR resonance circuit 10 is distorted by the coil L and the capacitor C (and the self-capacitance of the sensor electrode 11), and becomes a waveform that is nearly a sawtooth wave in which the rising edge and the falling edge are delayed, which undergoes half-wave rectification by the diode 21. Furthermore, the electrical signal at the detection point P3 is smoothed by the fixed resistor 22 and the capacitor 23 constituting a low-pass filter, whereafter a determination voltage signal $S_1$ that is close to a direct current is output via the buffer circuit 24.

Figure 3:
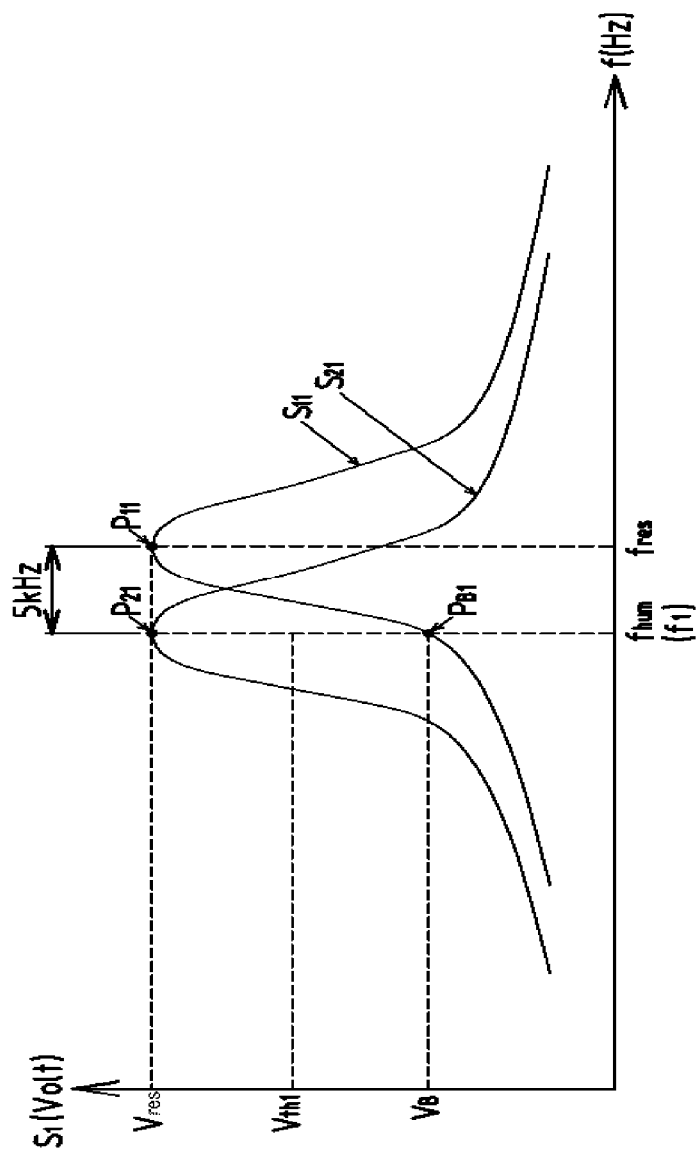
FIG. 3 is a graph showing the frequency characteristics in the capacitive proximity sensor according to one exemplary mode of embodiment of the present invention, and shows a state $S_{11}$ in which an object is not detected and a state $S_{21}$ in which an object is detected.

FIG. 3 shows the relationship between the frequency f (horizontal axis) of the high-frequency signal $S_0$ input to the LCR resonance circuit 10 and the determination voltage signal $S_1$ (vertical axis) under a constant surrounding environment. In FIG. 3, $S_{ii}$ is the curve in a situation when an object is not in the proximity of the sensor electrode 11, and $S_{21}$ is the curve in the situation when a human foot is in the proximity of the sensor electrode 11.

As shown in FIG. 3, the resonance frequency $f_{hum}$ when a human foot is in the proximity of the sensor electrode 11 is lower than the resonance frequency $f_{res}$ when an object is not in the proximity of the sensor electrode 11. This is because the self-capacitance of the sensor electrode 11 increases when a human foot approaches the sensor electrode 11. In the proximity sensor 1 of this example, under a constant surrounding environment, $f_{res}$ is approximately 450 kHz and $f_{hum}$ is approximately 445 kHz, but even if the surrounding environment changes, the difference between $f_{res}$ and $f_{hum}$ is essentially constant at approximately 5 kHz. Furthermore, the peak voltage when an object is not in the proximity of the sensor electrode 11 (voltage at the point $P_{11}$ in FIG. 3) and the peak voltage when a human foot is in the proximity of the sensor electrode 11 (voltage at the point $P_{21}$ in FIG. 3) are approximately the same, at $V_{res}$, even if the surrounding environment changes.

Next, an example of a human foot detection method according to the present invention will be briefly described. First, a frequency 5 kHz lower than the resonance frequency $f_{res}$ when the object is not in the proximity of the sensor electrode 11 is set as the detection frequency $f_1$. That is to say, in this example, the resonance frequency $f_{hum}$ when a human foot is in the proximity of the sensor electrode 11 is set as the detection frequency $f_1$.

Furthermore, if the determination voltage signal (voltage at the point $P_{11}$ in FIG. 3) when the high-frequency signal $S_0$ at the resonance frequency $f_{res}$ is input to the LCR resonance circuit 10, when an object is not in the proximity of the sensor electrode 11, is $V_{res}$, and the determination voltage signal (the voltage at the point $P_{B1}$ in FIG. 3) when the high-frequency signal of the detection frequency $f_1$ ($f_{hum}$) is input to the LCR resonance circuit 10 when an object is not in the proximity of the sensor electrode 11 is $V_B$, a first threshold value $V_{th1}$ that satisfies $$V_B < V_{th1} < V_{res}$$

is set.

When performing detection, a high-frequency signal $S_0$ at the detection frequency $f_1$ determined based on the resonance frequency $f_{res}$ applied to the LCR resonance circuit 10. However, since $f_{res}$ changes depending on changes in the climate and surrounding environment, $f_{res}$ is constantly updated to the most recent value by performing step control that controls the execution of calibration steps and a detection step described hereafter, and the detection frequency $f_1$ is reset based on the most recent $f_{res}$.

Figure 4:
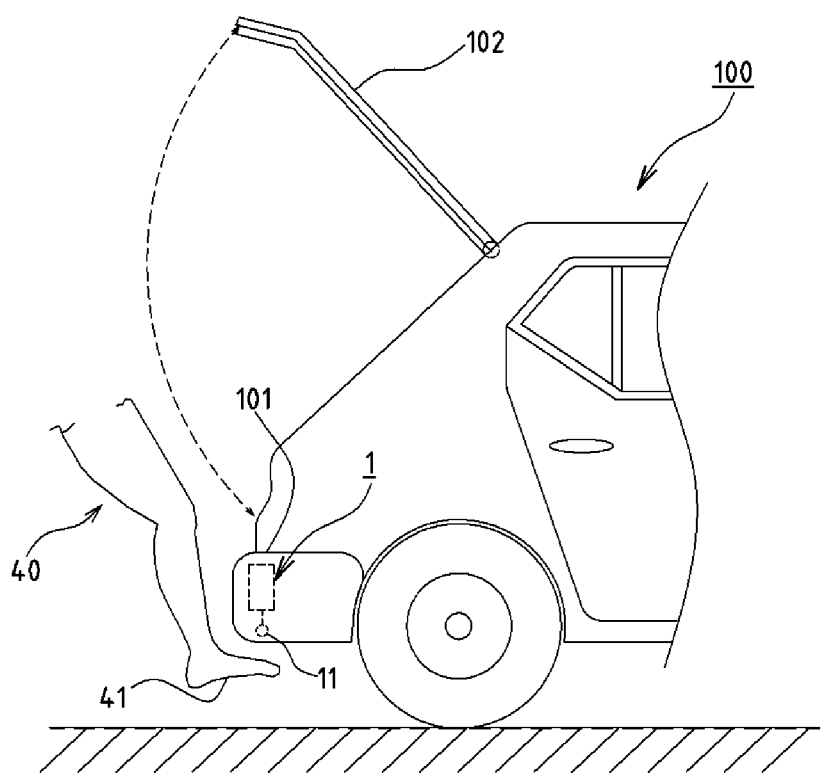
FIG. 4 is a schematic diagram showing the manner in which a foot is detected by the capacitive proximity sensor according to one exemplary mode of embodiment of the present invention.

In the proximity sensor 1 of this example, when a user 40 inserts a foot 41 below the rear bumper 101, as shown in FIG. 4, under a constant surrounding environment, the determination voltage signal $S_1$ changes from $V_B$ to $V_{res}$ and reaches the first threshold value $V_{th1}$ or higher. When this state is detected, the control unit 32 outputs a human detection signal $S_4$, and the opening/closing control is performed for the back door 102.

Figure 5:
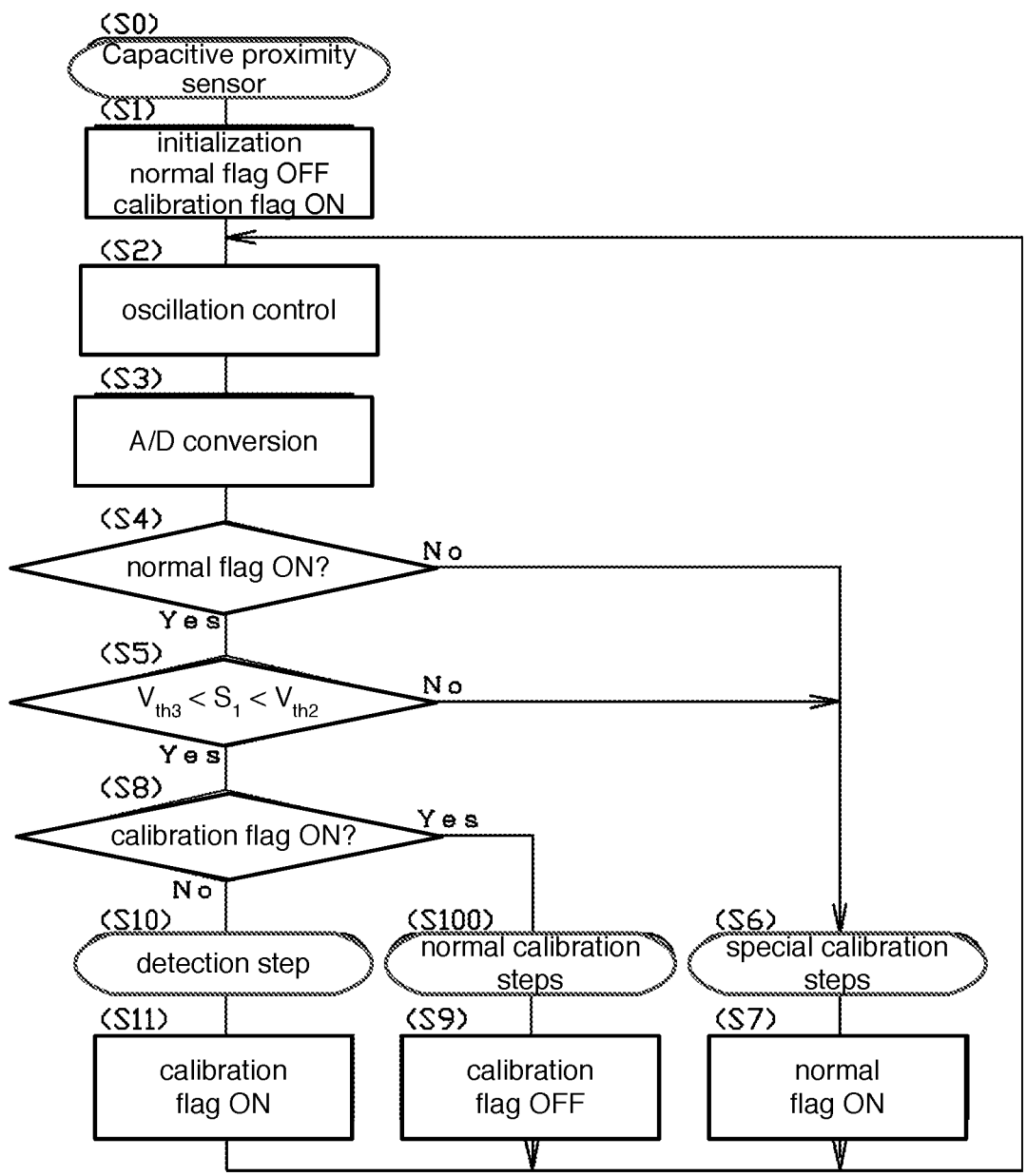
FIG. 5 is a main flowchart serving to describe the step control executed in the capacitive proximity sensor according to one exemplary mode of embodiment of the present invention.

Next, the operation of the proximity sensor 1 of this example will be described with reference to the flowcharts of FIG. 5 and FIG. 6.

Step S0

First, if a user carrying an electronic key is in the proximity of the automobile 100, wireless communication is performed between the authentication system installed in the vehicle and the electronic key, and this is authenticated as being an authorized electronic key for the automobile. Note that this authentication can be performed by known authentication methods for smart entry systems. Once this has been authenticated as being an authorized electronic key, the proximity sensor 1 is driven.

Step S1 The control unit 32 initializes the sensor system, clears the internal registers and memory, sets the normal flag to OFF, and sets the calibration flag to ON. Note that when the normal flag is ON, step control is performed in which the calibration steps and the detection steps are alternately performed as normal control, and when the normal flag is OFF, the calibration steps alone are continuously performed as special control.

Steps S2 to S3 The control unit 32 oscillates at the frequency of the high-frequency signal $S_0$ output from the high-frequency signal generation unit 33 with a predetermined duty ratio. Furthermore, when the AD converter 31 performs A/D conversion on the most recent determination voltage signal $S_1$ input from the sensor circuit 20, the most recent determination signal $S_2$ is output from the AD converter 31 to the control unit 32.

Step S4

If the normal flag is ON, the process proceeds to step S5, and if the normal flag is OFF, the process proceeds to step S6. Note that, when the proximity sensor 1 is initially driven, since the normal flag is OFF in step S1, the process always proceeds to step S6.

Step S5

If the most recent determination voltage signal $S_1$ is not within the predetermined range, it is determined that the situation is not normal, and the process proceeds to step S6. Meanwhile, if the most recent determination signal $S_1$ is within the predetermined range, the process proceeds to step S8. Note that, in this example, a second threshold value $V_{th2}$ is set to $V_B+0.8V$ and a third threshold value $V_{th3}$ is set to $V_B-0.1V$, and if the determination voltage signal $S_1$ is not within the range of $V_B-0.1$ V to $V_B+0.8V$, it is determined that situation is not normal.

Step S6

When the situation is not normal, special calibration is performed.

First, the control unit 32 performs control so as to perform a frequency sweep of the high-frequency signal $S_0$ input from the high-frequency signal generation unit 33 to the LCR resonance circuit 10. In this example, this frequency sweep is performed at a specified sweep rate from a start frequency of 200 kHz to a stop frequency of 600 kHz.

By performing the frequency sweep, the curve $S_{ii}$ shown in FIG. 3 is obtained, and the resonance frequency $f_{res}$ of the LCR resonance circuit 10 when an object is not in $f_{res}$ the proximity of the sensor electrode 11 and the voltage signal $V_{res}$ (voltage at point $P_{11}$) when the high-frequency signal at the resonance frequency $f_{res}$ is input to the LCR resonance circuit 10 are detected. Note that, in the proximity 1 of this example, the resonance frequency $f_{res}$ was 261 kHz and the voltage signal $V_{res}$ was 2.72 V under a constant environment.

Next, the control unit 32 sets the detection frequency $f_1$ and the first threshold value $V_{th1}$ shown in FIG. 3.

In this example, the detection frequency $f_1$ is set 5 kHz lower than the resonance frequency $f_{res}$. Furthermore, the first threshold value $V_{th1}$ is set based on the voltage signal $V_{res}$ (or $V_B$) in FIG. 3, and in this example, the first threshold value $V_{th1}$ is a value obtained by adding 12% of the voltage signal $V_{res}$ to the voltage signal $V_B$, when the high-frequency signal at the detection frequency $f_1$ is input to the LCR resonance circuit 10 in a situation where an object is not in the proximity of the sensor electrode 11.

Step S7

After performing the special calibration, the normal flag is set to ON and the process returns to step S2.

Step S8

The process checks the calibration flag, and if this calibration flag is ON, the process proceeds to step S100, while if the calibration flag is OFF, the process proceeds to step S10. Note that when the proximity sensor 1 is initially driven, since the calibration flag is ON in step S1, the process always proceeds to step S100.

Step S100

Figure 6:
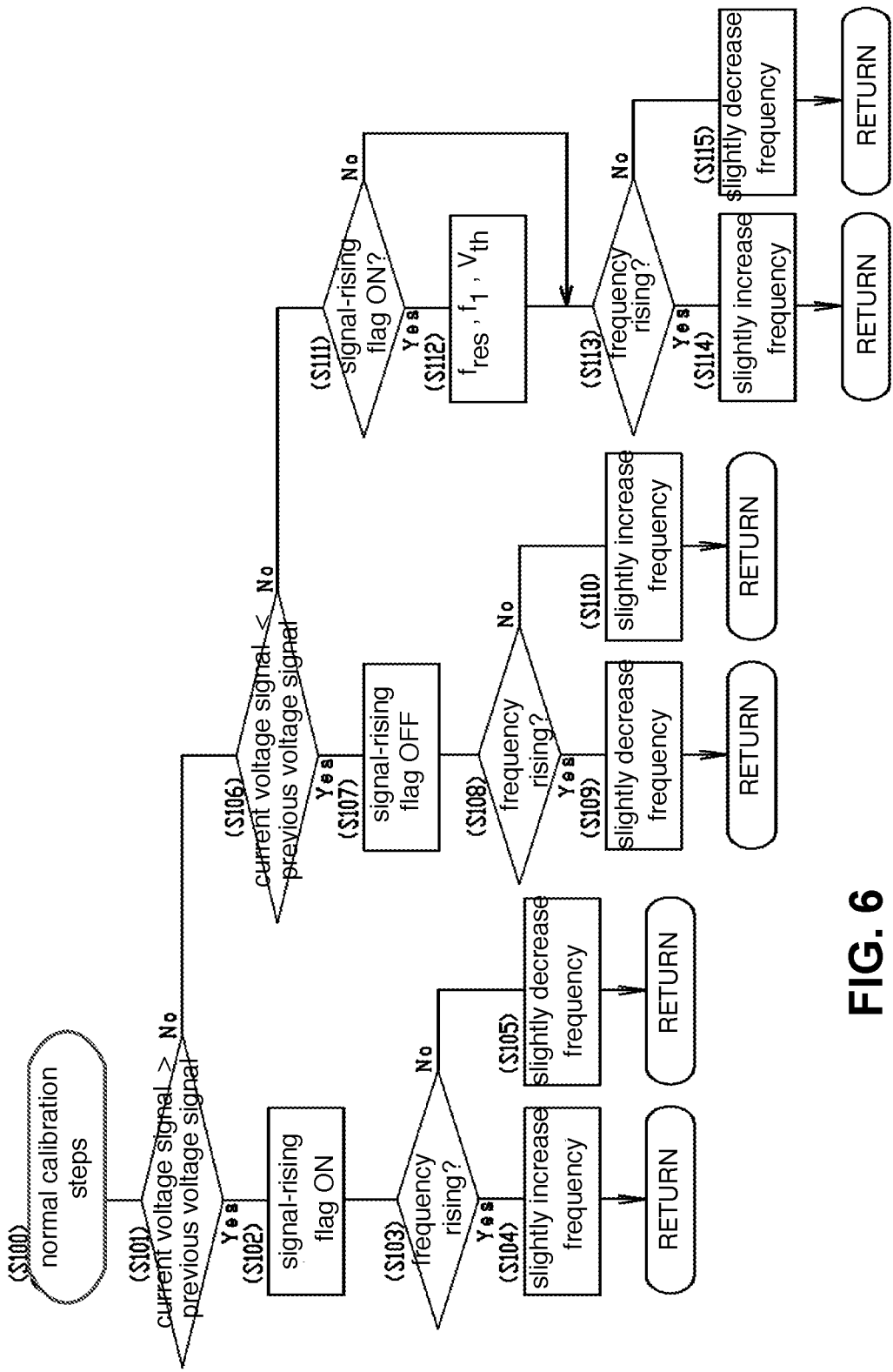
FIG. 6 is a flowchart serving to describe calibration steps in a normal routine in the capacitive proximity sensor according to one exemplary mode of embodiment of the present invention.

The normal calibration steps are executed in accordance with the flowchart in FIG. 6. These normal calibration steps are performed so that the proximity of the human body can be detected correctly even if the curve $S_{11}$ (see FIG. 3) when the object is not in the proximity of the sensor electrode 11 changes depending on the surrounding environment or the like.

Note that, in the following description, in iteration n−1 of the calibration steps, the frequency of the high-frequency signal $S_0$ is $f_{n-1}$, and the determination voltage signal is $V_{n-1}$, in iteration n of the calibration steps, the frequency of the high-frequency signal $S_0$ is $f_n$, and the determination voltage signal is $V_n$, in iteration n+1 of the calibration steps, the frequency of the high-frequency signal $S_0$ is $f_{n+1}$, and the determination voltage signal is $V_{n+1}$, and in iteration n+2 of the calibration steps, the frequency of the high-frequency signal $S_0$ is $f_{n+2}$.

Step S101

If $V_n > V_{n-1}$, the process proceeds to step S101, while otherwise, the process proceeds to step S106.

Steps S102 to S105

After the signal-rising flag is set to ON, if $f_n > f_{n-1}$, the frequency of the high-frequency signal $S_0$ is slightly increased (S104), and if $f_n < f_{n-1}$, the frequency of the high-frequency signal $S_0$ is slightly decreased (S105), whereafter the process proceeds to step S9.

Step S106

If $V_n < V_{n-1}$, the process proceeds to step S107, while otherwise (which is to say, if $V_n \approx V_{n-1}$), the process proceeds to step S111.

Steps S107 to S110

After the signal-rising flag is set to OFF, if $f_n > f_{n-1}$, the frequency of the high-frequency signal $S_0$ is slightly decreased (S109), and if $f_n < f_{n-1}$, the frequency of the high-frequency signal $S_0$ is slightly increased (S110), whereafter the process proceeds to step S9.

Step S111

If $V_n \approx V_{n-1}$, when the signal-rising flag is ON, the process proceeds to step S112, and when the signal-rising flag is OFF, the process proceeds to step S113. Note that, in this example, if the difference between $V_n$ and $V_{n-1}$ is 0.08 V or less, it is considered that $V_n \approx V_{n-1}$.

Step S112

If the signal-rising flag is ON and $V_n \approx V_{n-1}$, it is determined that the resonance frequency $f_{res}$ has been detected, and the detection frequency $f_1$ and the first threshold value $V_{th1}$ are set.

Steps S113 to S115

If $f_n > f_{n-1}$, the frequency of the high-frequency signal $S_0$ is slightly increased (S114), and if $f_n < f_{n-1}$, the frequency of the high-frequency signal $S_0$ is slightly decreased (S115), whereafter the process proceeds to step S9.

In the normal calibration steps, from step S101 to S115, the following is performed.

Figure 7:
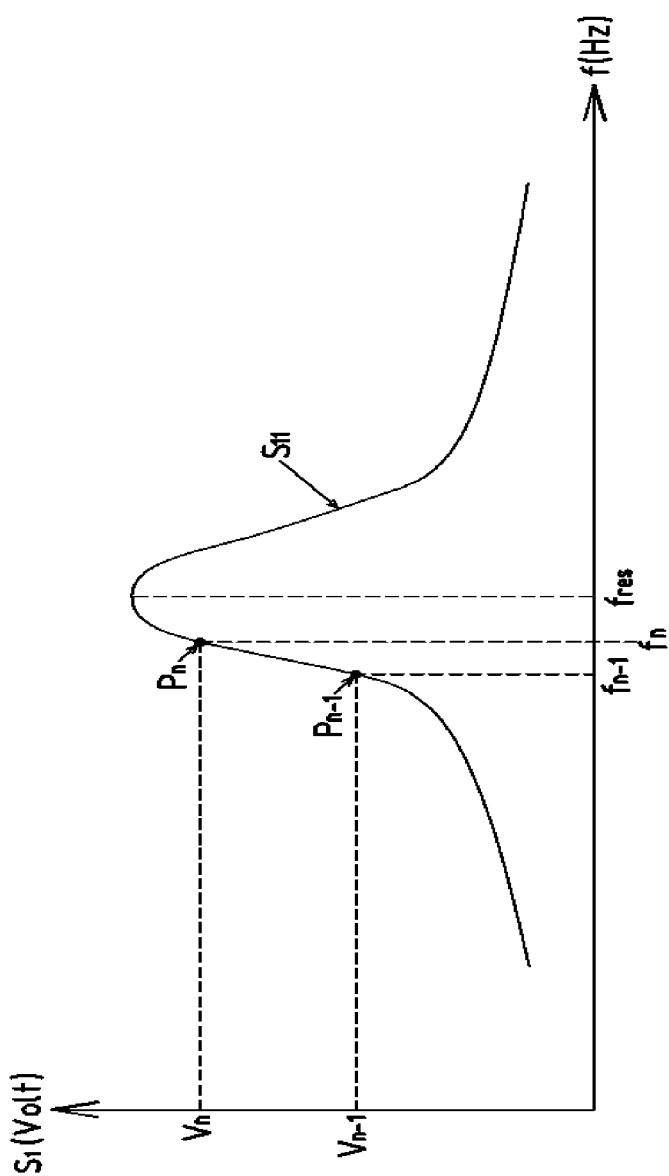
FIG. 7 is a graph serving to describe the calibration steps in the normal routine.

Specifically, in steps S101 to S105, when $V_n > V_{n-1}$ and $f_n > f_{n-1}$, $f_{n+1} > f_n$ is set. As shown in FIG. 7, in the case where the determination voltage signal rises from $V_{n-1}$ to $V_n$ when the frequency of the high-frequency signal $S_0$ is increased from $f_{n-1}$ to $f_n$, because $f_n$ is closer than $f_{n-1}$ to the resonance frequency $f_{res}$ in the current environment, in order to detect this resonance frequency $f_{res}$ in a short time, the frequency $f_{n+1}$ of the high-frequency signal $S_0$ in the next calibration steps will be set slightly higher than $f_n$.

Figure 8:
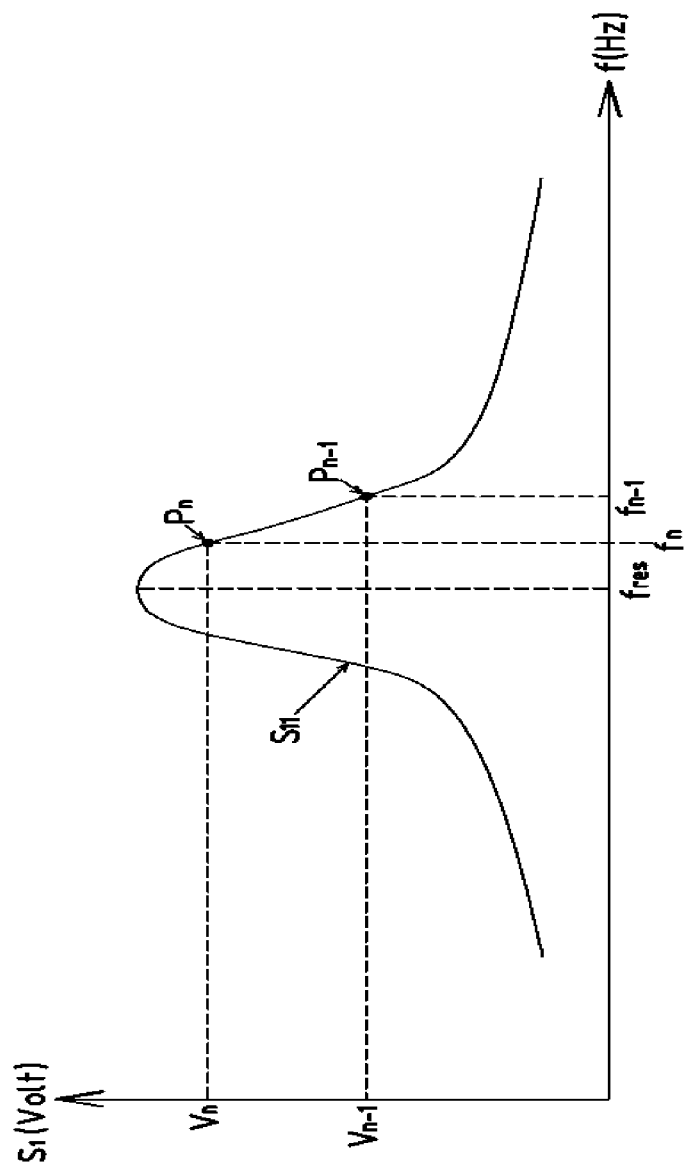
FIG. 8 is a graph serving to describe the calibration steps in the normal routine.

Furthermore, in steps S101 to S105, if $V_n > V_{n-1}$ and $f_n < f_{n-1}$, $f_{n+1} < f_n$ is set. This is because, as shown in FIG. 8, in the case where the determination voltage signal rises from $V_{n-1}$ to $V_n$ when the frequency of the high-frequency signal $S_0$ is decreased from $f_{n-1}$ to $f_n$, because $f_n$ is closer than $f_{n-1}$ to the resonance frequency $f_{res}$ in the current environment, in order to detect this resonance frequency $f_{res}$ in a short time, the frequency $f_{n+1}$ of the high-frequency signal $S_0$ in the next calibration steps will be set slightly lower than $f_n$.

Figure 9:
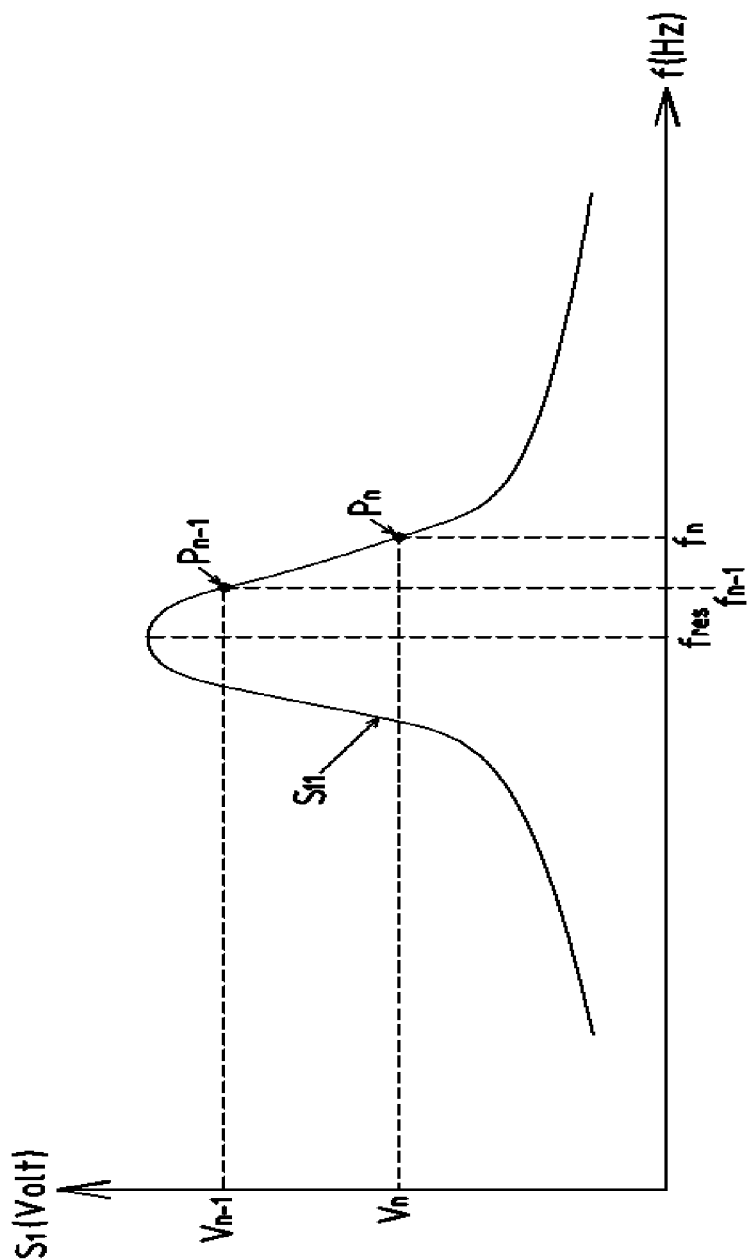
FIG. 9 is a graph serving to describe the calibration steps in the normal routine.

Furthermore, in steps S106 to S110, if $V_n < V_{n-1}$ and $f_n > f_{n-1}$, $f_{n+1} < f_n$ is set. This is because, as shown in FIG. 9, in the case where the determination voltage signal decreases from $V_{n-1}$ to $V_n$ when the frequency of the high-frequency signal $S_0$ is increased from $f_{n-1}$ to $f_n$, because $f_n$ is further than $f_{n-1}$ from the resonance frequency $f_{res}$ in the current environment, in order to detect this resonance frequency $f_{res}$ in a short time, the frequency $f_{n+1}$ of the high-frequency signal $S_0$ in the next calibration steps will be set slightly lower than $f_n$.

Figure 10:
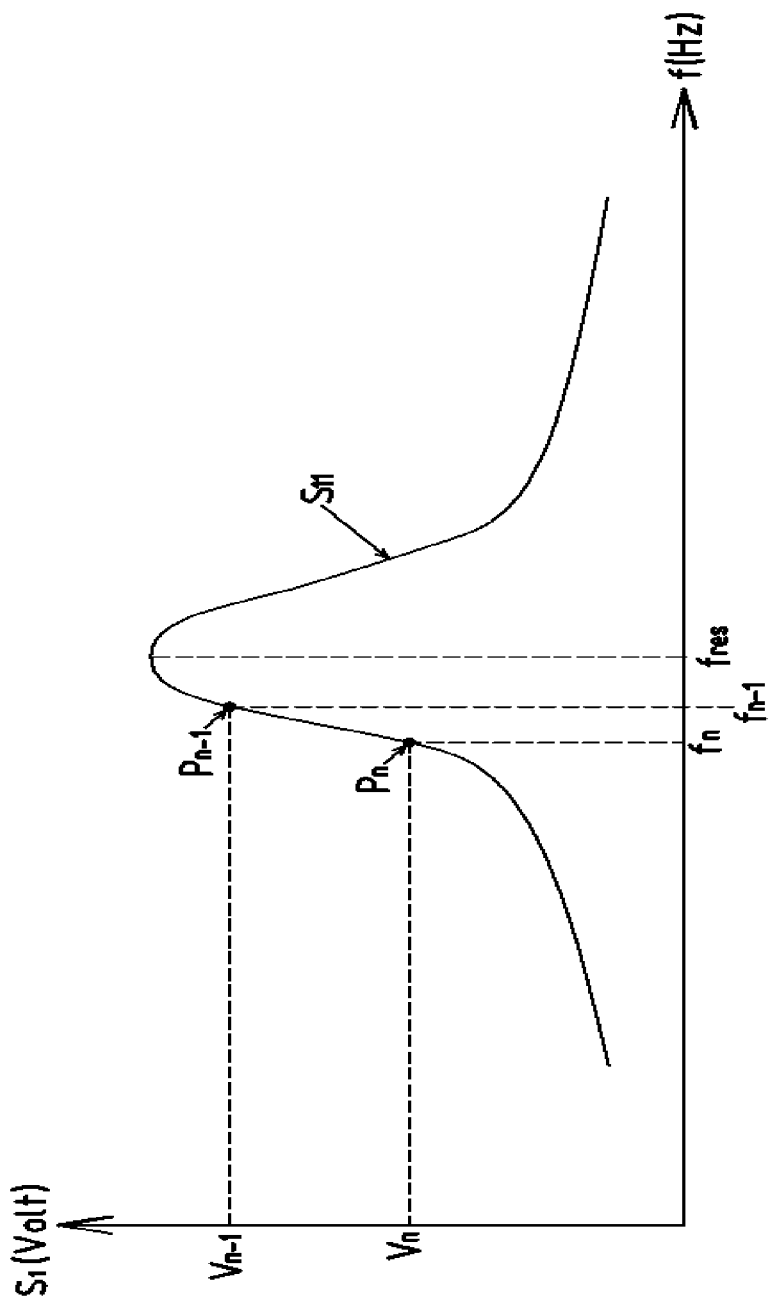
FIG. 10 is a graph serving to describe the calibration steps in the normal routine.

Further, in steps S106 to S110, if $V_n < V_{n-1}$ and $f_n < f_{n-1}$, $f_{n+1} > f_n$ is set. This is because, as shown in FIG. 10, in the case where the determination voltage signal decreases from $V_{n-1}$ to $V_n$ when the frequency of the high-frequency signal $S_0$ is decreased from $f_{n-1}$ to $f_n$, because $f_n$ is further than $f_{n-1}$ from the resonance frequency $f_{res}$ in the current environment, in order to detect this resonance frequency $f_{res}$ in a short time, the frequency $f_{n+1}$ of the high-frequency signal $S_0$ in the next calibration steps will be set slightly higher than $f_n$.

Figure 11:
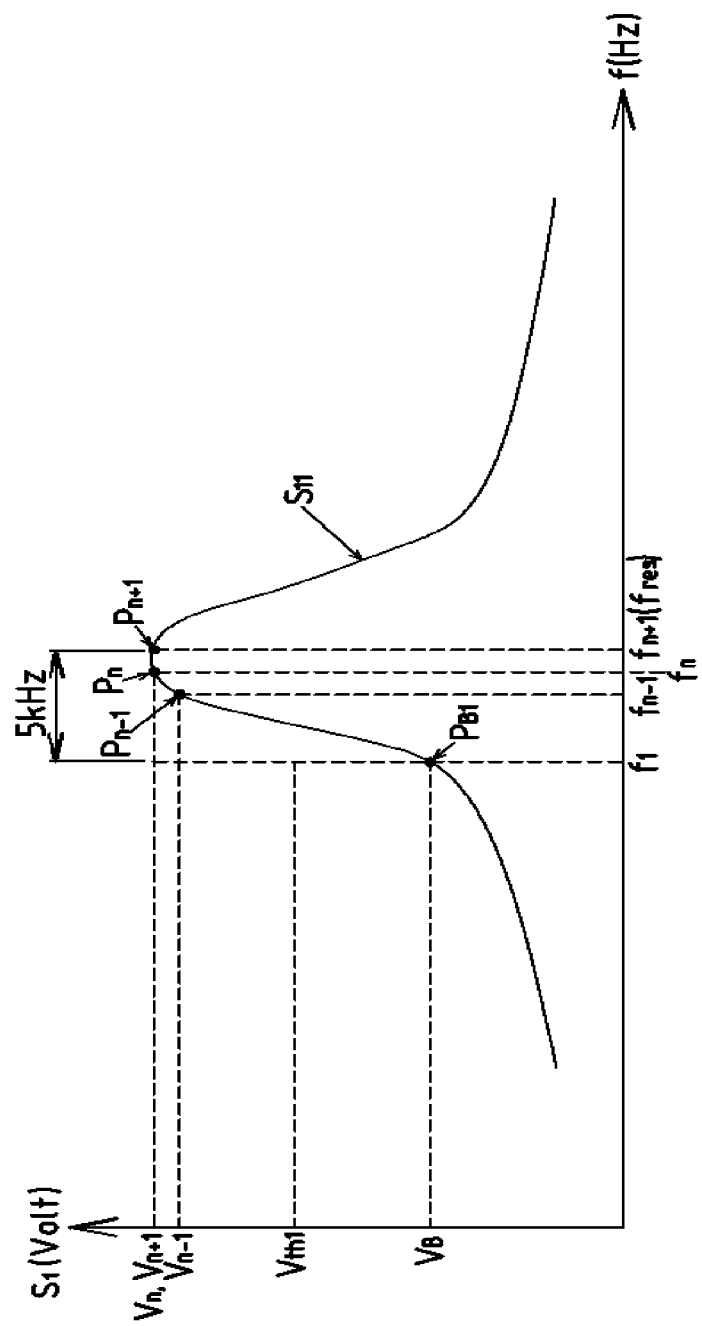
FIG. 11 is a graph serving to describe the calibration steps in the normal routine.
Figure 12:
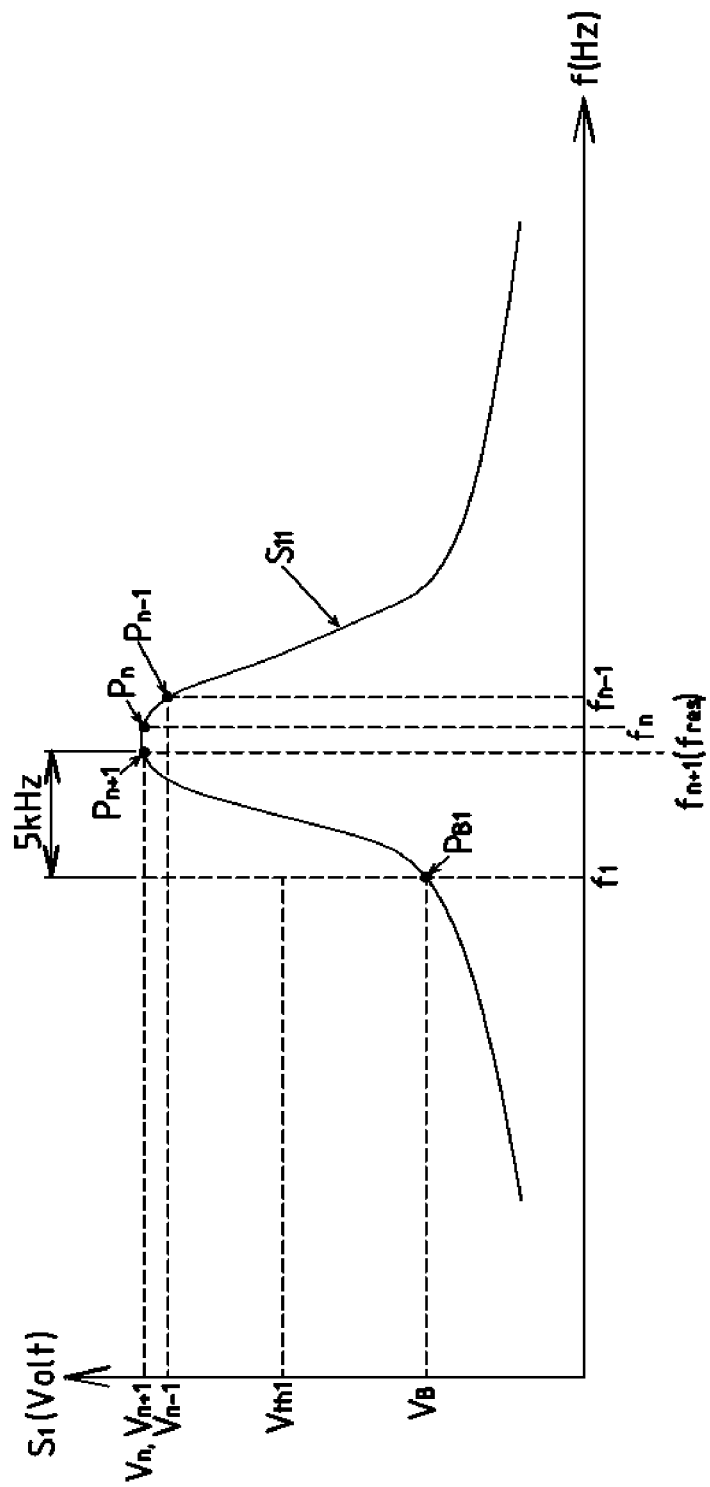
FIG. 12 is a graph serving to describe the calibration steps in the normal routine.

Further, in steps S111 to S112, if $V_n > V_{n-1}$ and $V_{n+1} \approx V_n$, it is considered that the resonance frequency $f_{res}$ is in the vicinity of $f_n$ and $f_{n+1}$. This is because, as shown in FIG. 11 and FIG. 12, in the calibration steps immediately after the determination voltage signal rises from $V_{n-1}$ to $V_n$, if $V_{n+1}$ and $V_n$ are at substantially the same level, $f_n$ and $f_{n+1}$ are considered to be substantially the resonant frequency $f_{res}$. Note that, in this example, both in the case where the resonance frequency is detected while increasing the frequency of the high-frequency signal $S_0$ as shown in FIG. 11 and in the case where the resonance frequency is detected while reducing the frequency of the high-frequency signal $S_0$ as shown in FIG. 12, $f_{n+1}$ is taken as the resonance frequency $f_{res}$. Furthermore, when the resonance frequency $f_{res}$ is detected, in this example, a frequency 5 kHz lower than the resonance frequency $f_{res}$ is set as the detection frequency $f_1$. Further, the first threshold value $V_{th1}$ is set on the basis of the determination voltage signal $V_{n+1}$ (the voltage at the point $P_{n+1}$ in FIG. 11) when the high-frequency signal at the resonance frequency $f_{res}$ is input to the sensor circuit 10 when an object is not in the proximity of the sensor electrode 11, and the determination voltage signal $V_B$ (the voltage at the in FIG. 11) when the high-frequency signal having the detection frequency $f_1$ is input to the sensor circuit 10 when an object is not in the proximity of the sensor electrode 11.

Furthermore, in steps S113 to S115, if $V_n > V_{n-1}$ and $V_{n+1} \approx V_n$ and $f_{n+1} > f_n$, $f_{n+2} > f_{n+1}$ is set. Further, in steps S113 to S115, if $V_n > V_{n-1}$ and $V_{n+1} \approx V_n$ and $f_{n+1} < f_n$, $f_{n+2} < f_{n+1}$ is set. These settings are performed in order that, both in the case where the resonance frequency $f_{res}$ is found while increasing the frequency of the high-frequency signal $S_0$ as shown in FIG. 11 and in the case where the resonance frequency $f_{res}$ is found while decreasing the frequency of the high-frequency signal $S_0$ as shown in FIG. 12, the calibration steps are always performed so as to surpass the point $P_{11}$ in FIG. 3. By executing the calibration steps in this manner, the resonance frequency $f_{res}$ can be updated to the most recent value in a very short time.

Step S9

After the normal calibration steps are executed according to the flowchart of FIG. 6, the calibration flag is set to OFF.

Step S10

If the calibration flag is OFF in step S8, a detection step is executed, and foot detection determination is performed. In this detection determination, the detection frequency $f_1$ and the first threshold value $V_{th1}$ that were updated in step S112 are used. Specifically, when it is detected that the determination voltage signal $S_1$ is equal to or higher than the first threshold value $V_{th1}$, with the high-frequency signal $S_0$ at the detection frequency $f_1$ input to the LCR resonance circuit 10, the proximity of a human body (foot) to the sensor electrode 11 is detected, the control unit 32 outputs a human detection signal $S_4$, and opening/closing control is performed for the back door 102.

Step S11

After performing the foot detection determination, the calibration flag is set to ON.

As described above, in the capacitive proximity sensor 1 of this example, the calibration flag is set to OFF after the normal calibration steps in step S100 (steps S101 to S115). Furthermore, after performing the detection step in step S10, the calibration flag is set to ON. Then, the control unit 32 performs step control which controls execution of the normal calibration steps in step S100, and the detection step in step S10. In this step control, if there is no sudden major environmental change (when the determination in step S5 is Yes), in step S8, the processing is alternately assigned to step S100 and step S10, and control is performed such that the normal calibration steps and detection step are repeatedly and alternatingly executed as a normal routine.

Furthermore, in the capacitive proximity sensor 1 of this example, in each of the calibration steps, in order to detect the resonance frequency $f_{res}$ the LCR resonance circuit 10 when the object is not in the proximity of the sensor electrode 11, the frequency of the high-frequency signal $S_0$ is changed according to the predetermined rules described above. Furthermore, when the resonance frequency $f_{res}$ has been detected, the detection frequency $f_t$ is set based on the resonance frequency $f_{res}$, and a first threshold value $V_{th1}$ is set based on the determination voltage signal $V_{res}$ when the high-frequency signal $S_0$ of the resonance frequency $f_{res}$ is input to the LCR resonance circuit 10. Furthermore, in the detection step, the proximity of a human body to the sensor electrode 11 is detected based on the result of comparison between the determination voltage signal $S_1$ detected when the high-frequency signal $S_0$ at the detection frequency $f_1$ is input to the LCR resonance circuit 10 and the first threshold value $V_{th1}$. Therefore, if there is no sudden major environmental change, even if the surrounding environment changes, detection can always be performed with the most recent detection frequency, which prevents erroneous detection and missed detection, such that the human body (foot) can be detected with high reliability.

Furthermore, in the capacitive proximity sensor 1 of this example, if $V_n > V_{n-1}$ and $f_n > f_{n-1}$, then $f_{n+1} > f_n$ is set,
if $V_n > V_{n-1}$ and $f_n < f_{n-1}$, then $f_{n+1} < f_n$ is set,
if $V_n < V_{n-1}$ and $f_n > f_{n-1}$, then $f_{n+1} < f_n$ is set, and
if $V_n < V_{n-1}$ and $f_n < f_{n-1}$, then $f_{n+1} > f_n$ is set.

Therefore, the resonance frequency $f_{res}$ can be updated in minimal time, and the proximity of the human body (foot) can be detected in minimal time, which prevents missed detection.

Furthermore, in the capacitive proximity sensor 1 of this example, in the calibration steps, if $V_n > V_{n-1}$ and $V_{n+1} \approx V_n$, then the resonance frequency $f_{res}$ is considered to be in the vicinity of $f_n$ and $f_{n+1}$.

Therefore, the resonance frequency $f_{res}$ can be updated in minimal time and with extremely high accuracy, such that the proximity of the human body (foot) can be highly reliably detected in minimal time.

Furthermore, in the capacitive proximity sensor 1 of this example, if $V_n > V_{n-1}$ and $V_{n+1} \approx V_n$ and $f_{n+1} > f_n$, then $f_{n+2} > f_{n+1}$ is set, and if $V_n > V_{n-1}$, $V_{n+1} \approx V_n$, and $f_{n+1} < f_n$, then $f_{n+2} < f_{n+1}$ is set.

Therefore, both in the case where the resonance frequency $f_{res}$ is found while increasing the frequency of the high-frequency signal $S_0$ as shown in FIG. 11 and in the case where the resonance frequency $f_{res}$ is found while decreasing the frequency of the high-frequency signal $S_0$ as shown in FIG. 12, the resonance frequency $f_{res}$ can be updated to the most recent value in minimal time.

Furthermore, in the capacitive proximity sensor 1 of this example, the step control includes a control (step S6) for continuously executing the calibration steps multiple times as a special routine, separately from the normal routine. Specifically, the control unit 32 sets a second threshold value $V_{th2}$ ($V_g + 0.8V$ in this example) and a third threshold value $V_{th3}$ that is lower than the second threshold value $V_{th2}$ ($V_B - 0.8V$ in this example), and executes a special routine when $V_n > V_{th2}$ or $V_n < V_{th3}$. Thereby, even when, for example, the environment where the vehicle is parked changes greatly such that the resonance frequency $f_{res}$ changes greatly, the resonance frequency $f_{res}$ can be updated to the most recent value in minimal time.

Exemplary modes of embodiment of the present invention were described above, but the present invention is not limited to the aforementioned exemplary modes of embodiment, and it is a matter of course that the exemplary modes of embodiment described above can be suitably modified, within a range that does not depart from the gist of the present invention.

For example, in step 112 in the exemplary mode of embodiment described above, $f_{n+1}$ is set as $f_{res}$ when $V_n > V_{n-1}$ and $V_{n+1} \approx V_n$, but $f_{res}$ can be considered to be in the vicinity of $f_n$ and $f_{n+1}$, and therefore $f_n$ may be set as $f_{res}$, or an intermediate frequency between $f_n$ and $f_{n+1}$ may be set as $f_{res}$.

Furthermore, in the exemplary mode of embodiment described above, the detection frequency $f_1$ is set to a frequency lower than the resonance frequency $f_{res}$, but if the detection frequency $f_1$ is set based on the resonance frequency $f_{res}$, the detection frequency $f_1$ may be set to a frequency higher than the resonance frequency $f_{res}$. Note that the method for setting the first threshold value $V_{th1}$ would also be changed depending on the method for setting the detection frequency $f_1$. However, if the detection frequency $f_1$ is set to a frequency lower than the resonance frequency $f_{res}$ as in the exemplary mode of embodiment described above, it is possible to make a determination that distinguishes between a human body and water.

Furthermore, in the exemplary mode of embodiment described above, a case in which the capacitive proximity sensor is mounted in the rear bumper of the vehicle was described, but the capacitive proximity sensor of the present invention can also be applied to a sliding door of a vehicle.

What is claimed is:

1. A capacitive proximity sensor, comprising:
an oscillation means, which outputs a high-frequency signal;
an LCR resonance circuit including a sensor electrode, to which the high-frequency signal is input;
a sensor circuit, which outputs a determination voltage signal corresponding to the capacitance of the sensor electrode; and
a control unit, which detects the proximity of a human body to the sensor electrode, on the basis of the determination voltage signal, wherein
the control unit performs step control, which controls the execution of calibration steps and a detection step;
the step control includes control for repeatedly and alternatingly executing the calibration steps and the detection step, as a normal routine;
in the calibration steps:
in each of the calibration steps, the frequency of the high-frequency signal is changed according to predetermined rules, in order to detect a resonance frequency $f_{res}$ of the LCR resonance circuit when an object is not in the $f_{res}$ proximity of the sensor electrode, and
when the resonance frequency $f_{res}$ is detected, the detection frequency $f_1$ is set based on the resonance frequency $f_{res}$, and a first threshold value $V_{th1}$ is set based on a determination voltage signal $V_{res}$ when a high-frequency signal at the resonance frequency $f_{res}$ is input to the LCR resonance circuit; and
in the detection step:
the proximity of the human body to the sensor electrode is detected based on the result of a comparison between the first threshold value $V_{th1}$ and the determination voltage signal detected with the high-frequency signal at the detection frequency $f_1$ input to the LCR resonance circuit.

2. The capacitive proximity sensor according to claim 1, wherein
in the calibration steps:
when, in iteration n−1 of the calibration steps, the frequency of the high-frequency signal is $f_{n-1}$, and the determination voltage signal is $V_{n-1}$,
in iteration n of the calibration steps, the frequency of the high-frequency signal is $f_n$, and the determination voltage signal is $V_n$, and
in iteration n+1 of the calibration steps, the frequency of the high-frequency signal is $f_{n+1}$, and the determination voltage signal is $V_{n+1}$,
if $V_n > V_{n-1}$ and $f_n > f_{n-1}$, then $f_{n+1} > f_n$ is set,
if $V_n > V_{n-1}$ and $f_n < f_{n-1}$, then $f_{n+1} < f_n$ is set,
if $V_n < V_{n-1}$ and $f_n > f_{n-1}$, then $f_{n+1} < f_n$ is set, and
if $V_n < V_{n-1}$ and $f_n < f_{n-1}$, then $f_{n+1} > f_n$ is set.

3. The capacitive proximity sensor according to claim 2, wherein
in the calibration steps:
if $V_n > V_{n-1}$ and $V_{n+1} \approx V_n$,
then the resonance frequency $f_{res}$ is considered to be in the vicinity of $f_n$ and $f_{n+1}$.

4. The capacitive proximity sensor according to claim 2, wherein
in the calibration steps:
when the frequency of the high-frequency signal in iteration n+2 of the calibration steps is $f_{n+2}$,
if $V_n > V_{n-1}$ and $V_{n+1} \approx V_n$ and $f_{n+1} > f_n$,
then $f_{n+2} > f_{n+1}$ is set,
if $V_n > V_{n-1}$ and $V_{n+1} \approx V_n$ and $f_{n+1} < f_n$,
then $f_{n+2} < f_{n+1}$ is set.

5. The capacitive proximity sensor according to claim 2, wherein
the step control includes control for continuously executing the calibration steps multiple times as a special routine, separately from the normal routine,
the control unit sets a second threshold value $V_{th2}$ and a third threshold value $V_{th3}$, which is lower than the second threshold value $V_{th2}$, and
the special routine is executed if
$V_n > V_{th2}$ or $V_n < V_{th3}$
for any n.

6. The capacitive proximity sensor according to claim 3, wherein
the step control includes control for continuously executing the calibration steps multiple times as a special routine, separately from the normal routine,
the control unit sets a second threshold value $V_{th2}$ and a third threshold value $V_{th3}$, which is lower than the second threshold value $V_{th2}$, and
the special routine is executed if
$V_n > V_{th2}$ or $V_n < V_{th3}$
for any n.

7. The capacitive proximity sensor according to claim 4, wherein
the step control includes control for continuously executing the calibration steps multiple times as a special routine, separately from the normal routine,
the control unit sets a second threshold value $V_{th2}$ and a third threshold value $V_{th3}$, which is lower than the second threshold value $V_{th2}$, and
the special routine is executed if
$V_n > V_{th2}$ or $V_n < V_{th3}$
for any n.

8. The capacitive proximity sensor according to claim 1, wherein
when the resonance frequency of the LCR resonance circuit when the human body is in the proximity of the sensor electrode is $f_{hum}$,
$f_{res} > f_{hum}$.

* * * * *